United States Patent
Kuwabara

(10) Patent No.: US 8,917,984 B2
(45) Date of Patent: Dec. 23, 2014

(54) PHOTOELECTRIC CONVERSION APPARATUS, FOCUS DETECTION APPARATUS, AND IMAGE PICKUP SYSTEM

(71) Applicant: Canon Kabushiki Kaisha, Tokyo (JP)

(72) Inventor: Hideshi Kuwabara, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/774,063

(22) Filed: Feb. 22, 2013

(65) Prior Publication Data

US 2013/0222661 A1  Aug. 29, 2013

(30) Foreign Application Priority Data

Feb. 29, 2012 (JP) .................... 2012-043963

(51) Int. Cl.
*G03B 3/10*  (2006.01)
*H04N 5/232*  (2006.01)
*H01L 27/146*  (2006.01)
*G03B 13/36*  (2006.01)
*G02B 7/34*  (2006.01)

(52) U.S. Cl.
CPC .......... *H04N 5/232* (2013.01); *H01L 27/14603* (2013.01); *G03B 13/36* (2013.01); *H01L 27/14636* (2013.01); *G02B 7/346* (2013.01); *H01L 27/14612* (2013.01)
USPC ........................................................ 396/121

(58) Field of Classification Search
CPC .................. G02B 7/346; G02B 7/28
USPC ........................................................ 396/121
See application file for complete search history.

(56) References Cited

U.S. PATENT DOCUMENTS

| | | | | |
|---|---|---|---|---|
| 5,257,062 A * | 10/1993 | Moriyama | .................... | 396/114 |
| 6,072,956 A * | 6/2000 | Hamada et al. | ............... | 396/104 |
| 8,097,812 B2 * | 1/2012 | Wang et al. | .................... | 174/254 |
| 8,160,437 B2 * | 4/2012 | Hamano | ...................... | 396/114 |
| 8,259,044 B2 * | 9/2012 | Nathan et al. | .................... | 345/82 |
| 2009/0041406 A1 * | 2/2009 | Schulz | ............................. | 385/14 |
| 2009/0051791 A1 * | 2/2009 | Ohta | ............................. | 348/246 |
| 2009/0066824 A1 * | 3/2009 | Sugiyama | ..................... | 348/302 |
| 2009/0091648 A1 * | 4/2009 | Lin et al. | ......................... | 348/301 |
| 2009/0256060 A1 * | 10/2009 | Meynants et al. | .......... | 250/208.1 |
| 2009/0284804 A1 * | 11/2009 | Matsuda et al. | ............... | 358/448 |
| 2010/0200278 A1 * | 8/2010 | Wang et al. | .................... | 174/254 |
| 2011/0025892 A1 * | 2/2011 | Hibbeler et al. | ............. | 348/294 |
| 2011/0042723 A1 * | 2/2011 | Mabuchi | ....................... | 257/225 |
| 2011/0176793 A1 * | 7/2011 | Shu | ............................... | 396/114 |
| 2011/0205416 A1 * | 8/2011 | Nishihara | ..................... | 348/300 |
| 2011/0221022 A1 * | 9/2011 | Toda | ............................. | 257/432 |
| 2013/0244435 A1 * | 9/2013 | Tanabe, Ryo | ................. | 438/694 |

FOREIGN PATENT DOCUMENTS

JP   2011-100077 A   5/2011

\* cited by examiner

*Primary Examiner* — Clayton E Laballe
*Assistant Examiner* — Linda B Smith
(74) *Attorney, Agent, or Firm* — Canon USA, Inc. IP Division

(57) ABSTRACT

A photoelectric conversion apparatus includes a first line sensor unit in which a plurality of pixels are arranged in a first direction, a second line sensor unit in which a plurality of pixels are arranged in a second direction, and a third line sensor unit in which a plurality of pixels are arranged in a third direction. Each of the pixels includes a photoelectric conversion portion and a transistor. The second direction is perpendicular to the first direction and the third direction is not perpendicular to the first and the second directions. A channel of the transistor is provided in the first direction or the second direction.

13 Claims, 11 Drawing Sheets

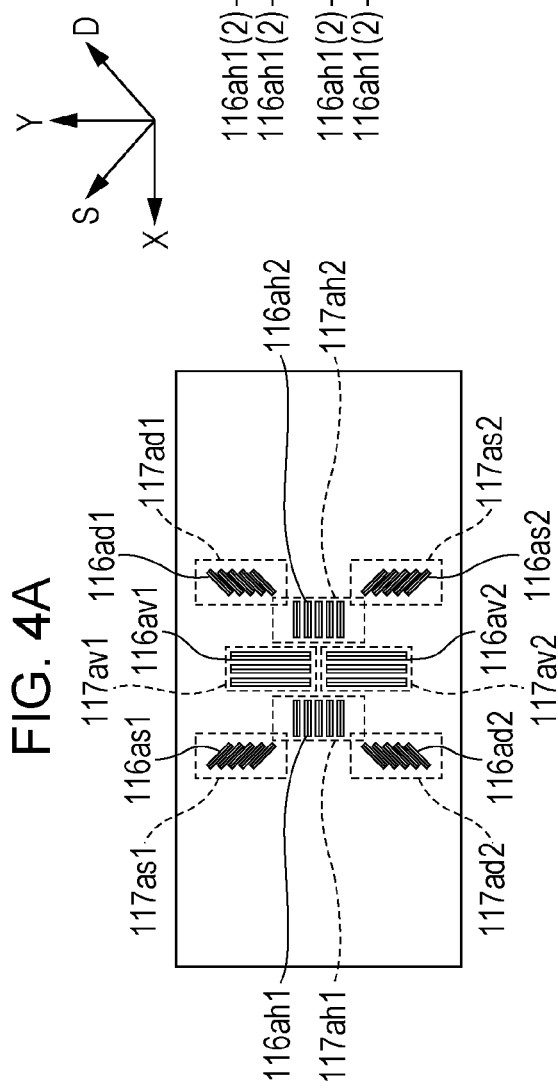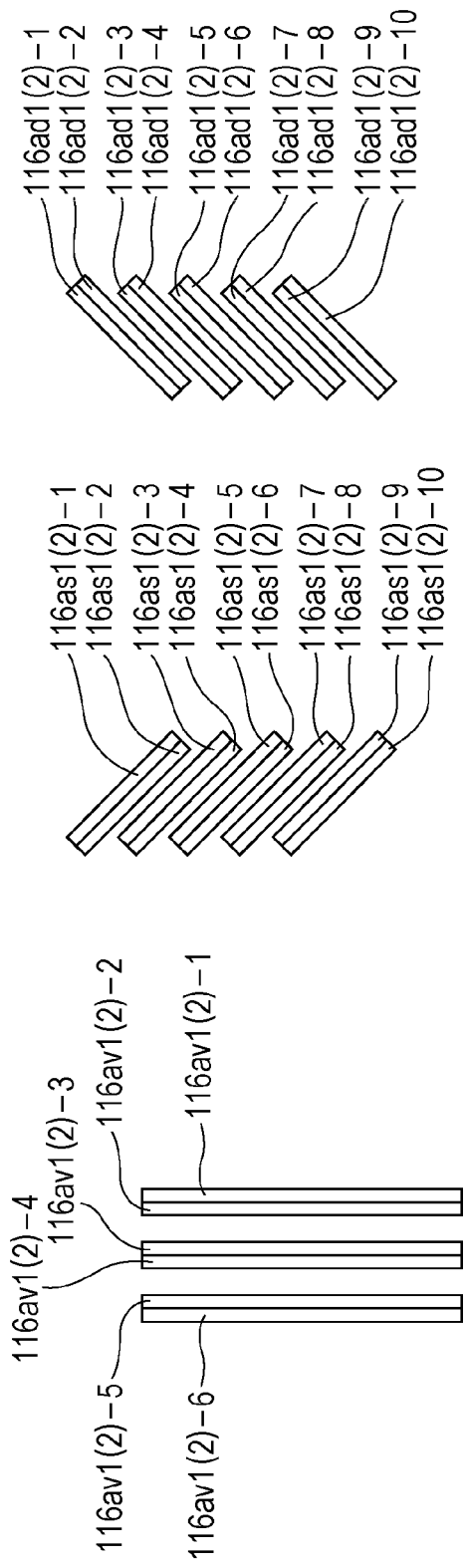

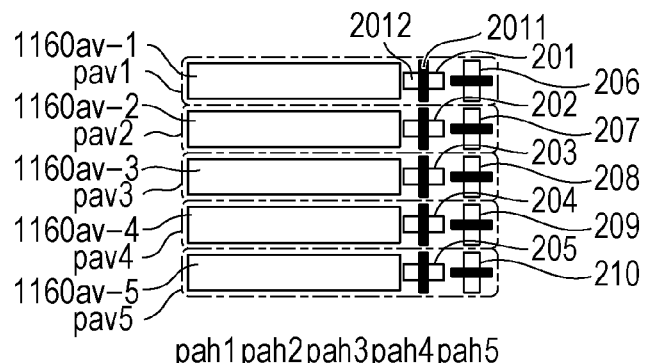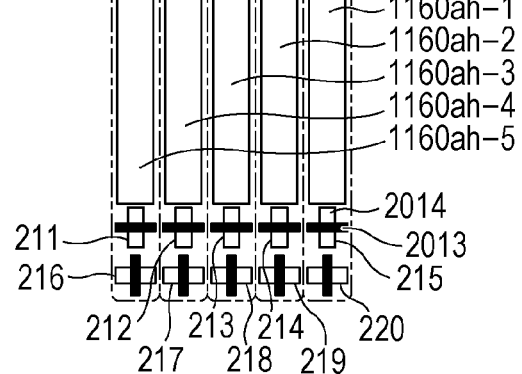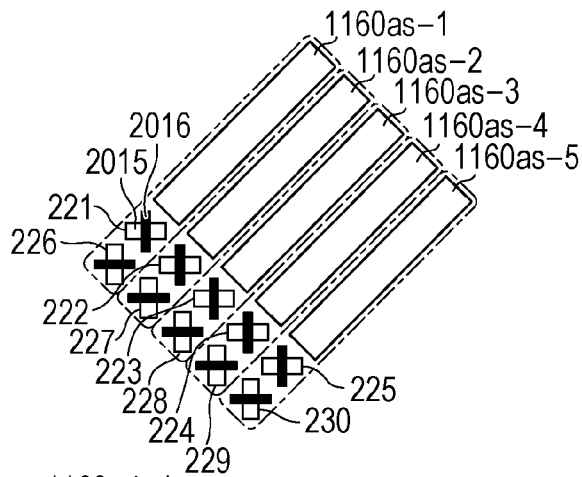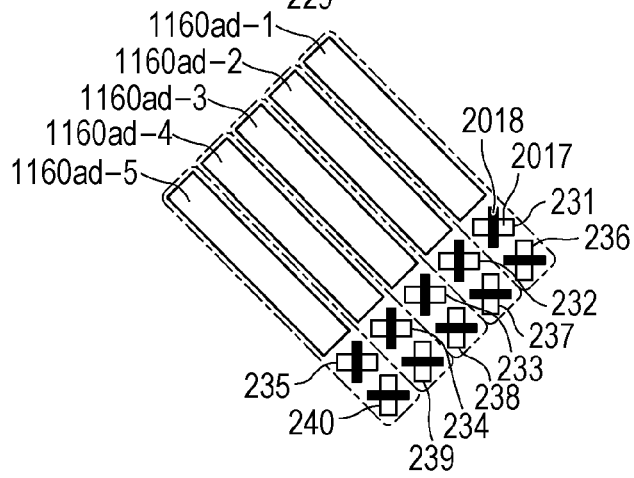

PHOTOELECTRIC CONVERSION APPARATUS, FOCUS DETECTION APPARATUS, AND IMAGE PICKUP SYSTEM

BACKGROUND OF THE INVENTION

1. Field of the Invention

One disclosed aspect of the embodiments relates to a photoelectric conversion apparatus, a focus detection apparatus, and an image pickup system.

2. Description of the Related Art

It is known that an image pickup apparatus such as a digital camera and a digital video camera includes a focus detection apparatus. Japanese Patent Laid-Open No. 2011-100077 describes a focus detection apparatus including a photoelectric conversion apparatus having focus detection regions in a vertical direction, a horizontal direction, and a diagonal direction with respect to an image pickup area of an image pickup sensor. However, in Japanese Patent Laid-Open No. 2011-100077, a detailed structure of the photoelectric conversion apparatus is not sufficiently discussed, so that there is a risk that a focal point cannot be accurately detected.

SUMMARY OF THE INVENTION

One disclosed aspect of the embodiments provides a photoelectric conversion apparatus including a first line sensor unit in which a plurality of pixels are arranged in a first direction, a second line sensor unit in which a plurality of pixels are arranged in a second direction, and a third line sensor unit in which a plurality of pixels are arranged in a third direction. Each of the pixels includes a photoelectric conversion portion and a transistor. The second direction is perpendicular to the first direction and the third direction is not perpendicular to the first and the second directions. A channel of the transistor is provided in the first direction or the second direction.

Further features of the disclosure will become apparent from the following description of exemplary embodiments with reference to the attached drawings.

BRIEF DESCRIPTION OF THE DRAWINGS

FIGS. 4A, 4B, 4C, 4D, and 4E are schematic plan views showing a focus detection sensor according to the first embodiment.

FIGS. 5A, 5B, 5C, and 5D are diagrams showing a configuration of pixels in the focus detection sensor according to the first embodiment.

DESCRIPTION OF THE EMBODIMENTS

Embodiments will be described with reference to the drawings.

First Embodiment

Figure 1:
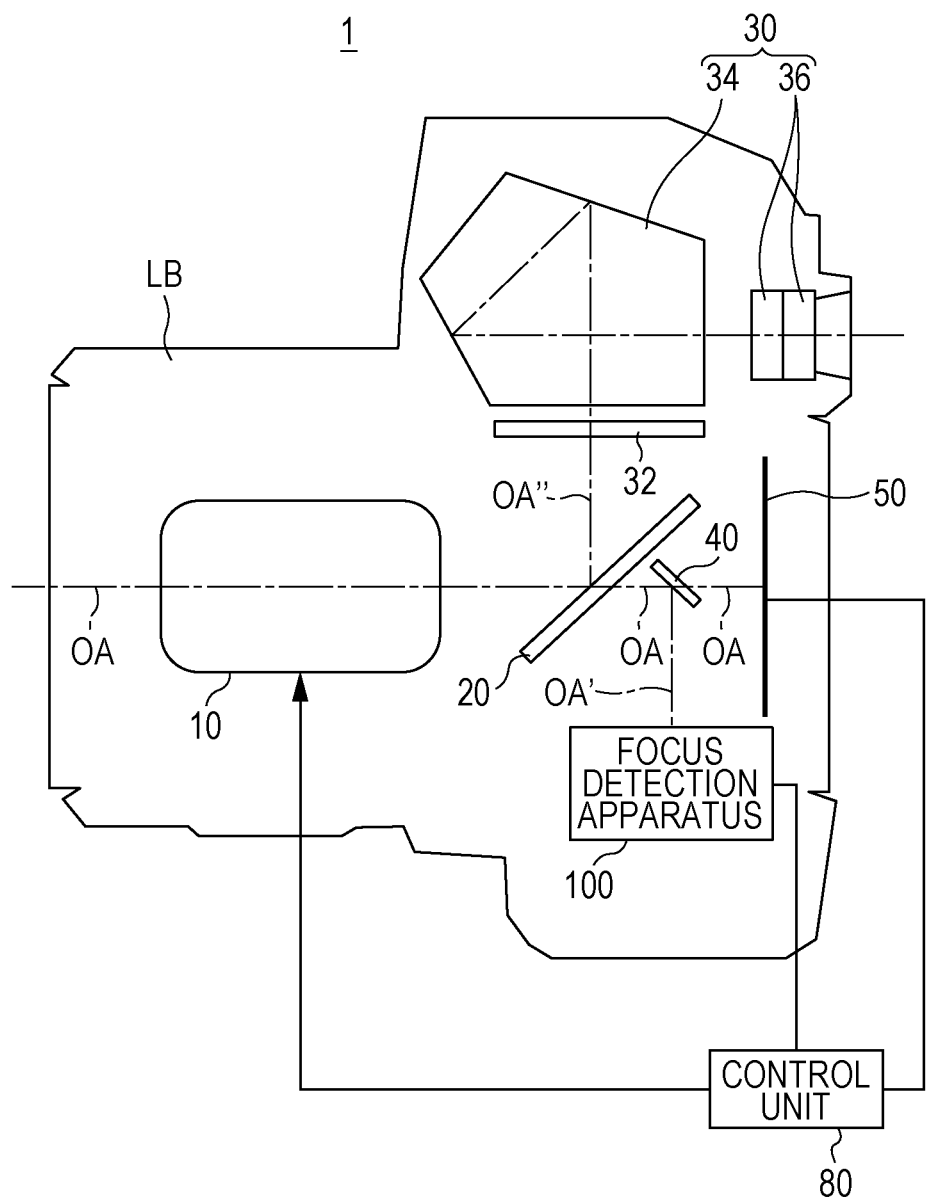
FIG. 1 is a schematic configuration diagram of an image pickup apparatus according to a first embodiment.

As shown in FIG. 1, an image pickup apparatus 1 includes an image pickup lens 10 and a camera main body. The camera main body is configured so that the image pickup lens may be attached and removed through a mount portion not shown in FIG. 1. The image pickup apparatus 1 is, for example, a single lens reflex camera.

The image pickup lens 10 is a replaceable image pickup lens for forming an image of an object on an image pickup device. The image pickup lens 10 includes an image pickup optical system including a focus adjustment lens not shown in FIG. 1. The focus (state) of the image pickup lens 10 is adjusted by a control unit 80 described later according to a result of a focus detection process performed by a focus detection apparatus 100 described later. The image pickup lens 10 is held by a lens barrel LB so that the image pickup lens 10 may be moved in an optical axis OA direction. Although the image pickup lens 10 is not a component of the image pickup apparatus 1 when the image pickup lens 10 is removed from the camera main body, the image pickup lens 10 is required to be attached to the camera main body when the focus detection apparatus 100 performs focus detection, so that the image pickup lens 10 is treated as a component of the image pickup apparatus 1.

The camera main body includes a main mirror 20, a finder optical system 30, a sub-mirror 40, an image pickup device 50, the focus detection apparatus 100, and the control unit 80.

The main mirror 20 is formed by a partially-transmissive half mirror or a movable mirror on a part of which a half mirror surface is included. The main mirror 20 reflects a part of light passing through the image pickup lens 10 and guides the reflected light along an optical axis OA" to the finder optical system 30 described later. On the other hand, the main mirror 20 lets a part of the light passing through the image pickup lens 10 pass through and guides the passing light along an optical axis OA to the sub-mirror 40 described later.

The finder optical system 30 is an optical system for observing an object, the image of which is captured. In other words, the finder optical system 30 artificially provides an observation image equivalent to the image of the object, the image of which is captured, to a user. As shown in FIG. 1, the finder optical system 30 includes a focusing plate 32, a pentaprism 34, and an eye lens 36.

The light from the image pickup lens 10, which is reflected by the main mirror 20, is collected near the focusing plate 32. The focusing plate 32 diffuses object light and emits the diffused object light to the pentaprism 34. The pentaprism 34 is an optical path conversion device. The pentaprism 34 reflects the light diffused by the focusing plate 32 by a plurality of surfaces and guides the light to the eye lens 36. The eye lens 36 is configured so that a user may observe a finder's field of view formed on the focusing plate 32 through the eye lens 36.

The sub-mirror 40 is disposed on a downstream side of the optical axis OA with respect to the main mirror 20. The sub-mirror 40 reflects the light (transmitted light) passing through the main mirror 20 and guides the reflected light to the focus detection apparatus 100 along the optical axis OA'. The optical axis OA' is an optical axis deflected from the optical axis OA by the sub-mirror 40. The sub-mirror 40 is configured to be able to be inserted into or removed from an image pickup optical path (optical axis OA). The sub-mirror 40 is disposed into a predetermined position on the image pickup optical path (optical axis OA) when an object is observed from the finder and is removed from the image pickup optical path (optical axis OA) when an image of the object is captured.

The image pickup device 50 includes a pixel array in which a plurality of pixels are regularly arranged. Typically, the pixels are arranged in a matrix pattern. The image pickup device 50 converts an image of the object, which is formed on an image pickup area (pixel array) by the image pickup lens 10, into an image signal. For example, the image pickup device 50 is formed by an area (two-dimensional) sensor, which photoelectrically converts received light for each pixel and accumulates an electrical charge according to received light quantity for each pixel, and from which the electrical charges are read. The image pickup device 50 may be formed by, for example, a CMOS image sensor or a CCD image sensor. A predetermined process is performed on an output signal from the image pickup device 50 by an image processing circuit not shown in FIG. 1. Thereby the output signal becomes image data and the image data is converted into image data to be recorded. Thereafter, the image data to be recorded is recorded in a recording medium such as a semiconductor memory, an optical disk, and a magnetic tape which are not shown in FIG. 1.

The focus detection apparatus 100 detects a focus state of the image pickup lens 10 by using a phase difference method. In other words, the focus detection apparatus 100 divides the light which passes through the image pickup lens 10 and is reflected by the sub-mirror 40 and detects the focus state of the image pickup lens 10 according to a positional relationship between a plurality of images formed by divided light fluxes. Specifically, the focus detection apparatus 100 forms a plurality of pairs of images and detects the focus state of the image pickup lens 10 according to a signal obtained by photoelectrically converting each pair of images.

Figure 2:
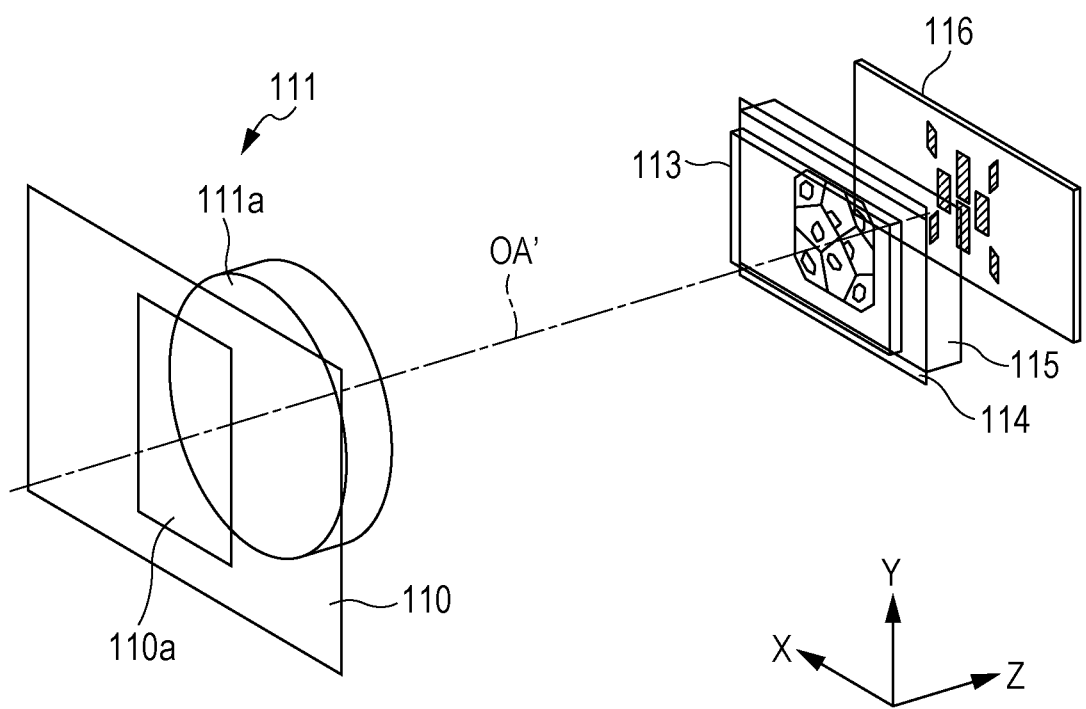
FIG. 2 is a schematic perspective view showing a configuration of a focus detection apparatus according to the first embodiment.

The focus detection apparatus 100 will be more specifically described. As shown in FIG. 2, the focus detection apparatus 100 includes a field of view mask 110, a field lens 111, a filter 113, a multi-hole aperture 114, a re-imaging lens unit (secondary optical system) 115, and a focus detection sensor 116 along the optical axis OA' in this order.

The field of view mask 110 includes a rectangular opening 110a for limiting a light flux passing through the image pickup lens 10 in the central portion thereof. The field of view mask 110 is disposed near a predetermined image plane of the image pickup lens 10.

The field lens 111 is disposed on the downstream side of the optical axis OA' with respect to the field of view mask 110. The field lens 111 includes a lens member 111a having an optical effect. The lens member 111a is a portion corresponding to the opening 110a of the field of view mask 110 in the field lens 111.

The filter 113 blocks light having a wavelength longer than that of near infrared light. The filter 113 is applied to detect the focal point of the image pickup lens 10 aberration-corrected with respect to visible light and prevent unnecessary infrared light from entering the focus detection sensor 116.

Figure 3:
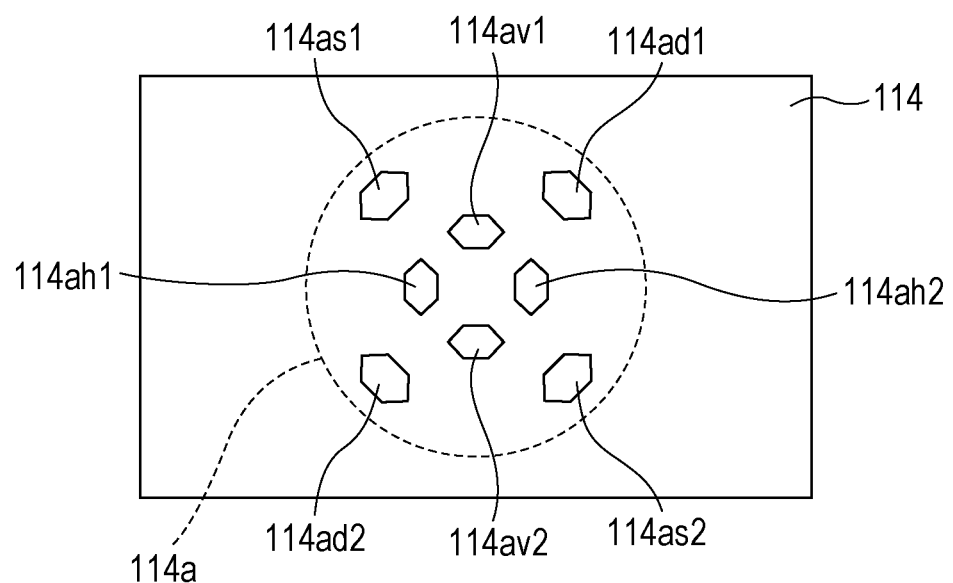
FIG. 3 is a schematic plan view showing a multi-hole aperture of the focus detection apparatus according to the first embodiment.

The multi-hole aperture 114 is formed of a thin film and disposed adjacent to the filter 113 on the downstream side of the optical axis OA'. The multi-hole aperture 114 includes an opening 114a and the opening 114a includes openings 114av1, 114av2, 114ah1, 114ah2, 114as1, 114as2, 114ad1, and 114ad2. As shown in FIG. 3, the multi-hole aperture 114 includes a pair of openings 114av1 and 114av2 arranged in the longitudinal direction (Y direction) of the opening 110a and a pair of openings 114ah1 and 114ah2 arranged in the short direction (X direction) of the opening 110a. Further, the multi-hole aperture 114 includes a pair of openings 114as1 and 114as2 arranged in a left-up 45 degrees diagonal direction and a pair of openings 114ad1 and 114ad2 arranged in a right-up 45 degrees diagonal direction in the central portion thereof.

The re-imaging lens unit 115 includes a first focus detection optical system FD1 and a second focus detection optical system FD2. The first focus detection optical system FD1 divides the light flux limited by the opening 110a of the field of view mask 110 in at least one direction of the longitudinal direction (Y direction) and the short direction (X direction) of the opening 110a. The second focus detection optical system FD2 divides the light flux limited by the opening 110a of the field of view mask 110 in a diagonal direction making an acute angle (for example, 45 degrees) with the longitudinal direction of the opening 110a in a plane perpendicular to the optical axis of the light flux. The re-imaging lens unit 115 forms a re-imaged image (secondary image) of the object image on the predetermined image plane formed by the image pickup lens 10 on each device array in a plurality of pairs of device arrays of the focus detection sensor 116 disposed on the downstream side of the optical axis OA'. In each device array in each pair of the device arrays, as described later, a plurality of focus detection devices are arranged in a predetermined direction. The re-imaging lens unit 115 includes prism portions and lens portions corresponding to the four pairs of openings included in the multi-hole aperture 114.

Next, a focus detection operation of the focus detection apparatus 100 will be described. Here, suffixes 1 and 2 of the reference numerals in FIG. 3 represent a pair of elements that form a pair of object images in a focus detection apparatus using a phase difference method.

The openings 114av1, 114av2, 114ah1, and 114ah2 of the multi-hole aperture 114 are arranged to be inscribed in substantially the same circle. The openings 114as1, 114as2, 114ad1, and 114ad2 of the multi-hole aperture 114 are arranged to be inscribed in substantially the same circle which has the same center as that of the above inscribed circle and has a diameter larger than that of the above inscribed circle. By arranging the openings as described above, the light flux of the image pickup lens 10 brighter (having an F number smaller) than that which reaches the openings 114av1, 114av2, 114ah1, and 114ah2 reaches the openings 114as1, 114as2, 114ad1, and 114ad2.

Next, the light flux passing through the opening 110a of the field of view mask 110 (the light flux limited by the opening 110a) is guided to the prism portion and the lens portion included in the re-imaging lens unit 115 located on the downstream side of the optical axis OA' with respect to the multi-hole aperture 114. The opening 110a of the focus detection apparatus 100 is provided for the focus detection optical system including the lens member 111a of the field lens 111, the opening 114*a* of the multi-hole aperture 114, and the prism portion 1151*a* and the lens portion 1152*a* of the re-imaging lens unit 115.

The light flux emitted from the re-imaging lens unit 115 enters the focus detection sensor 116 located on the downstream side of the optical axis OA'. Four pairs of secondary images (that is, eight secondary images) of an object image (optical image) of the opening 110*a* of the field of view mask 110 are formed on the focus detection sensor 116.

FIG. 4A a schematic plan view showing the focus detection sensor 116 on which the object images are formed. In FIG. 4A, reference numerals 117*av*1 to 117*ad*2 denote the optical images formed by the opening 110*a* of the field of view mask 110 when the image pickup lens 10 is focused. Two optical images corresponding to one opening of the field of view mask 110 are formed by a function of a pair of openings (corresponding to suffixes 1 and 2) of the multi-hole aperture 114 and a pair of the prism portion and the lens portion of the re-imaging lens unit 115.

A pair of light fluxes divided in the longitudinal direction (Y direction) of the opening 11*a* by the first focus detection optical system FD1 form a pair of optical images 117*av*1 and 117*av*2. A pair of light fluxes divided in the short direction (X direction) of the opening 11*a* by the first focus detection optical system FD1 form a pair of optical images 117*ah*1 and 117*ah*2. A pair of light fluxes divided in a left-up 45 degrees diagonal direction by the second focus detection optical system FD2 form a pair of optical images 117 *as*1 and 117 *as*2. A pair of light fluxes divided in a right-up 45 degrees diagonal direction by the second focus detection optical system FD2 form a pair of optical images 117*ad*1 and 117*ad*2.

A pair of device arrays 116*av*1 and 116*av*2 are arranged inside the pair of optical images 117*av*1 and 117*av*2. In the pair of device arrays 116*av*1 and 116*av*2, six pairs of focus detection devices 116*av*1-1 to 116*av*1-6 and 116*av*2-1 to 116*av*2-6 extending in the longitudinal direction (Y direction) of the opening 110*a* are arranged. Here, the focus detection devices having the same number after the hyphen form a pair. In each device array of the pair of device arrays 116*av*1 and 116*av*2, a plurality of focus detection devices are arranged in the short direction (X direction) of the opening 110*a*. Thereby, it is possible to define a plurality of third focus detection areas which are arranged in the short direction (X direction) of the opening 110*a* and which extend in the longitudinal direction (Y direction) of the opening 110*a* in a picture plane on the predetermined image plane of the image pickup lens 10.

Similarly, a pair of device arrays 116*ah*1 and 116*ah*2 are arranged inside the pair of optical images 117*ah*1 and 117*ah*2. In the pair of device arrays 116*ah*1 and 116*ah*2, ten pairs of focus detection devices 116*ah*1-1 to 116*ah*1-10 and 116*ah*2-1 to 116*ah*2-10 extending in the short direction of the opening 110*a* are arranged. Here, the focus detection devices having the same number after the hyphen form a pair. In each device array of the pair of device arrays 116*ah*1 and 116*ah*2, a plurality of focus detection devices are arranged in the longitudinal direction of the opening 110*a*. Thereby, it is possible to define a plurality of fourth focus detection areas which are arranged in the longitudinal direction of the opening 110*a* and which extend in the short direction of the opening 110*a* in the picture plane on the predetermined image plane of the image pickup lens 10.

As a result, the focus detection sensor 116 includes a plurality of first focus detection devices 116*av*1-1 to 116*av*1-6, 116*av*2-1 to 116*av*2-6, 116*ah*1-1 to 116*ah*1-10, and 116*ah*2-1 to 116*ah*2-10 shown in FIGS. 4B and 4C. The plurality of first focus detection devices receive the light fluxes divided by the first focus detection optical system FD1. Each first focus detection device photoelectrically converts the received light to generate a signal (electrical charge) for detecting a focal point. Each first focus detection device is, for example, a photodiode. The plurality of first focus detection devices define a plurality of first focus detection regions which extend in division directions of the first focus detection optical system FD1 in the picture plane on the predetermined image plane of the image pickup lens and which are arranged at predetermined arrangement intervals. The plurality of first focus detection regions include the plurality of third focus detection areas and the plurality of fourth focus detection areas. Thereby, it is possible to define a plurality of focus detection regions (focus detection areas) extending in approximate lattice directions on the predetermined image plane of the image pickup lens 10. Therefore, it is easy to improve a processing accuracy of focus detection without depending on a (direction of) spatial pattern of the object.

Similarly, a pair of device arrays 116 *as*1 and 116 *as*2 are arranged inside a pair of optical images 117 *as*1 and 117 *as*2. In the pair of device arrays 116 *as*1 and 116 *as*2, ten pairs of focus detection devices 116 *as*1-1 to 116 *as*1-10 and 116 *as*2-1 to 116 *as*2-10 extending in a left-up 45 degrees diagonal direction are arranged. Here, the focus detection devices having the same number after the hyphen form a pair. In each device array of the pair of device arrays 116 *as*1 and 116 *as*2, a plurality of focus detection devices are arranged in the longitudinal direction of the opening 110*a*. Thereby, it is possible to define a plurality of first focus detection areas 115*as*-1 to 115*as*-10 which are arranged in the longitudinal direction of the opening 110*a* and which extend in the left-up 45 degrees diagonal direction in the picture plane on the predetermined image plane of the image pickup lens 10.

Similarly, a pair of device arrays 116*ad*1 and 116*ad*2 are arranged inside a pair of optical images 117*ad*1 and 117*ad*2. In the pair of device arrays 116*ad*1 and 116*ad*2, ten pairs of focus detection devices 116*ad*1-1 to 116*ad*1-10 and 116*ad*2-1 to 116*ad*2-10 extending in a right-up 45 degrees diagonal direction are arranged. Here, the focus detection devices having the same number after the hyphen form a pair. In each device array of the pair of device arrays 116*ad*1 and 116*ad*2, a plurality of focus detection devices are arranged in the longitudinal direction of the opening 110*a*. Thereby, it is possible to define a plurality of second focus detection areas 115*ad*-1 to 115*ad*-10 which are arranged in the longitudinal direction of the opening 110*a* and which extend in the right-up 45 degrees diagonal direction in the picture plane on the predetermined image plane of the image pickup lens 10.

As a result, the focus detection sensor 116 includes a plurality of second focus detection devices 116 *as*1-1 to 116 *as*1-10, 116 *as*2-1 to 116 *as*2-10, 116*ad*1-1 to 116*ad*1-10, and 116*ad*2-1 to 116*ad*2-10 shown in FIGS. 4D and 4E. The plurality of second focus detection devices receive the light fluxes divided by the second focus detection optical system FD2. Each second focus detection device photoelectrically converts the received light to generate a signal (electrical charge) for detecting a focal point. Each second focus detection device is, for example, a photodiode. The plurality of second focus detection devices define a plurality of second focus detection areas which extend in division directions of the second focus detection optical system FD2 in the picture plane on the predetermined image plane of the image pickup lens. The plurality of second focus detection regions include the plurality of first focus detection areas 115*as*-1 to 115*as*-10 and the plurality of second focus detection areas 115*ad*-1 to 115*ad*-10. Thereby, it is possible to define a plurality of focus detection regions (focus detection areas) which extend in the left-up 45 degrees diagonal direction and the right-up 45 degrees diagonal direction so as to cross each other and which are arranged in the longitudinal direction of the opening 110a. Therefore, it is easy to improve a processing accuracy of focus detection without depending on a (direction of) spatial pattern of the object by using the focus detection regions along with the aforementioned focus detection regions extending in approximate lattice directions.

When the image pickup device 50 has a plurality of pixels arranged in a matrix form, if the rows and columns of the matrix are assumed to be in parallel with a first direction and a second direction respectively, the second focus detection devices 116 as1-1 to 116 as1-10, 116 as2-1 to 116 as2-10, 116ad1-1, to, 116ad1-10, and 116ad2-1, to 116ad2-10 are arranged in diagonal directions with respect to the matrix of the image pickup device.

Next, a detailed configuration of the focus detection sensor according to the present embodiment will be described. The photoelectric conversion apparatus used as the focus detection sensor is assumed to be an apparatus in which a plurality of focus detection devices are formed on a semiconductor substrate.

FIG. 5A shows one of the first focus detection devices 116av1-1 to 116av1-6 and 116av2-1 to 116av2-6 as a typical example. Here, the first focus detection devices are collectively referred to as a focus detection device 116av as a first line sensor unit.

The focus detection device 116av includes five pixels pav1 to pav5. The pixels pav1 to pav5 include photodiodes 1160av-1 to 1160av-5 and MOS transistors 201 to 205 and 206 to 210 respectively. The MOS transistors 201 to 210 are provided to amplify a signal based on electrical charge generated from the photodiodes 1160av-1 to 1160av-5 and transfer the electrical charge when the MOS transistors have an electrical charge transfer structure. The MOS transistors 201 to 210 are exemplarily shown. In FIG. 5A, reference numeral 2011 denotes the gate of the MOS transistor 201 and reference numeral 2012 denotes the main electrode region of the MOS transistor 201. The focus detection device 116av1 is disposed away from the focus detection device 116av2 used as a fourth line sensor unit and makes a pair with the focus detection device 116av2. The pixels included in the focus detection device 116av2 are arranged along the first direction.

In the focus detection device 116av, the pixels pav1 to pav5 are arranged along the Y direction. The channels of the MOS transistors 201 to 205 are provided in the X direction in FIG. 5A. Here, "the channel of the transistor is provided in the X direction" means a configuration in which a channel region formed below the gate when the transistor is turned on causes a source region and a drain region located in the X direction to be electrically connected to each other. On the other hand, the channels of the MOS transistors 206 to 210 are provided in the Y direction. In other words, when the Y direction is defined as the first direction and the X direction is defined as the second direction, the pixels pav1 to pav5 are arranged in the first direction and the channels of the transistors included in the pixels pav1 to pav5 are provided in the first or the second direction.

Here, the direction in which the channel of the transistor is provided may be rephrased as a direction in which a current flows between the source and the drain when the transistor is conductive. The direction may be further rephrased as a direction in which a gate electrode that controls conduction between the source and the drain which form parts of the transistor respectively orthogonally intersects a side in contact with the source and the drain when the transistor is seen from above.

Next, FIG. 5B shows one of the focus detection devices 116ah1-1 to 116ah1-10 and 116ah2-1 to 116ah2-10 as a typical example. Here, the focus detection devices are collectively referred to as a focus detection device 116ah as a second line sensor unit.

The focus detection device 116ah includes five pixels pah1 to pah5. The pixels pah1 to pah5 include photodiodes 1160ah-1 to 1160ah-5 and MOS transistors 211 to 215 and 216 to 220 respectively. The MOS transistors 211 to 220 are provided to amplify a signal based on electrical charge generated from the photodiodes 1160ah-1 to 1160ah-5 and transfer the electrical charge when the MOS transistors have an electrical charge transfer structure. The MOS transistors 211 to 220 are exemplarily shown. In FIG. 5B, reference numeral 2013 denotes the gate of the MOS transistor 211 and reference numeral 2014 denotes the main electrode region of the MOS transistor 211. The focus detection device 116ah1 is disposed away from the focus detection device 116ah2 used as a fifth line sensor unit and makes a pair with the focus detection device 116ah2. The pixels included in the focus detection device 116ah2 are arranged along the second direction.

In the focus detection device 116ah, the pixels pah1 to pah5 are arranged along the X direction. The channels of the MOS transistors 211 to 215 are provided in the Y direction in FIG. 5B. Here, "the channel of the transistor is provided in the Y direction" means a configuration in which a channel region formed below the gate when the transistor is turned on causes a source region and a drain region located in the Y direction to be electrically connected to each other. On the other hand, the channels of the MOS transistors 216 to 220 are provided in the X direction. In other words, when the Y direction is defined as the first direction and the X direction is defined as the second direction, the pixels pah1 to pah5 are arranged in the second direction and the channels of the transistors included in the pixels pah1 to pah5 are provided in the first or the second direction.

Next, FIG. 5C shows one of the focus detection devices 116 as1-1 to 116 as1-10 and 116 as2-1 to 116 as2-10 as a typical example. Here, the focus detection devices are collectively referred to as a focus detection device 116 as as a third line sensor unit.

The focus detection device 116 as includes five pixels pas1 to pas5. The pixels pas1 to pas5 include photodiodes 1160as-1 to 1160as-5 and MOS transistors 221 to 225 and 226 to 230 respectively. The MOS transistors 221 to 230 are provided to amplify a signal based on electrical charge generated from the photodiodes 1160as-1 to 1160as-5 and transfer the electrical charge when the MOS transistors have an electrical charge transfer structure. The MOS transistors 221 to 230 are exemplarily shown. In FIG. 5C, reference numeral 2015 denotes the gate of the MOS transistor 221 and reference numeral 2016 denotes the main electrode region of the MOS transistor 221. The focus detection device 116 as1 is disposed away from the focus detection device 116 as2 used as a sixth line sensor unit and makes a pair with the focus detection device 116 as2. The pixels included in the focus detection device 116 as2 are arranged along a third direction.

In the focus detection device 116 as, the pixels pas1 to pas5 are arranged along an S direction. The channels of the MOS transistors 221 to 225 are provided in the Y direction in FIG. 5C. Here, "the channel of the transistor is provided in the Y direction" means a configuration in which a channel region formed below the gate when the transistor is turned on causes a source region and a drain region located in the Y direction to be electrically connected to each other. On the other hand, the channels of the MOS transistors 226 to 230 are provided in the X direction. In other words, when the Y direction is defined as the first direction, the X direction is defined as the second direction, and the S direction is defined as the third direction, the pixels pas1 to pas5 are arranged in the third direction and the channels of the transistors included in the pixels pas1 to pas5 are provided in the first or the second direction.

Next, FIG. 5D shows one of the focus detection devices 116ad1-1 to 116ad1-10 and 116ad2-1 to 116ad2-10 as a typical example. Here, the focus detection devices are collectively referred to as a focus detection device 116ad as a seventh line sensor unit.

The focus detection device 116ad includes five pixels pad1 to pad5. The pixels pad1 to pad5 include photodiodes 1160ad-1 to 1160ad-5 and MOS transistors 231 to 235 and 236 to 240 respectively. The MOS transistors 231 to 240 are provided to amplify a signal based on electrical charge generated from the photodiodes 1160ad-1 to 1160ad-5 and transfer the electrical charge when the MOS transistors have an electrical charge transfer structure. The MOS transistors 231 to 240 are exemplarily shown. In FIG. 5D, reference numeral 2017 denotes the gate of the MOS transistor 231 and reference numeral 2018 denotes the main electrode region of the MOS transistor 231. The focus detection device 116ad1 is disposed away from the focus detection device 116ad2 used as an eighth line sensor unit and makes a pair with the focus detection device 116ad2. The pixels included in the focus detection device 116ad2 are arranged along a fourth direction.

In the focus detection device 116ad, the pixels pad1 to pad5 are arranged along a D direction. The channels of the MOS transistors 231 to 235 are provided in the Y direction in FIG. 5D. Here, "the channel of the transistor is provided in the Y direction" means a configuration in which a channel region formed below the gate when the transistor is turned on causes a source region and a drain region located in the Y direction to be electrically connected to each other. On the other hand, the channels of the MOS transistors 236 to 240 are provided in the X direction. In other words, when the Y direction is defined as the first direction, the X direction is defined as the second direction, and the D direction is defined as the fourth direction, the pixels pad1 to pad5 are arranged in the fourth direction and the channels of the transistors included in the pixels pad1 to pad5 are provided in the first or the second direction.

When generalizing the above description, the photoelectric conversion apparatus includes the first line sensor in which a plurality of pixels are arranged along the first direction, the second line sensor in which a plurality of pixels are arranged along the second direction, and the third line sensor in which a plurality of pixels are arranged along the third direction. The first direction and the second direction are perpendicular to each other. The third direction is a direction different from the first and the second directions. The channels of the transistors included in the first to the third line sensors are provided in the first or the second direction. When the photoelectric conversion apparatus further includes another line sensor, pixels included in the line sensor are arranged in the fourth direction different from the first to the third directions. The channels of the transistors included in the line sensor are also provided in the first or the second direction.

"Directions of channels of two transistors are perpendicular to each other" may be rephrased as "although two transistors are not in the same plane direction with respect to a semiconductor substrate on which the transistors are formed, the transistors are in plane directions equivalent to each other". It may be also represented that, when seeing two transistors from above, a direction of a tangent line of a side on which the gate electrode of one transistor is in contact with the source and the drain orthogonally intersects a direction of a tangent line of a side on which the gate electrode of the other transistor is in contact with the source and the drain. For example, in FIG. 5A, a side on which the gate electrode 2011 of the transistor 201 is in contact with the source and the drain is in the Y direction and a side on which the gate electrode of the transistor 206 is in contact with the source and the drain is in the X direction, so that the direction of the channel of the transistor 201 and the direction of the channel of the transistor 206 are perpendicular to each other.

The advantage of the configuration of the photoelectric conversion apparatus described above will be described. Generally, a MOS transistor formed on a semiconductor substrate varies its characteristics depending on the direction of the channel. This is because a semiconductor substrate has plane directions and carrier mobility has a plane direction dependence. As a result, MOS transistors which are formed on the same substrate and whose channel directions are different from each other have different device characteristics. Generally, it is easy to cause two transistors whose channel directions are perpendicular to each other to have characteristics corresponding to each other. This is because, in transistors formed so that the channel directions are perpendicular to each other, the channels are formed in plane directions equivalent to each other.

On the other hand, it is difficult to cause a transistor whose channel direction is diagonal to the directions perpendicular to each other to have characteristics corresponding to the characteristics of the transistors in which the channels are provided in the directions perpendicular to each other due to the plane direction dependence of the carrier mobility. Therefore, in the present embodiment, regardless of the direction in which the pixels are arranged, the channel of the transistor included in each pixel is provided in the first or the second direction, so that the characteristics of the transistors may correspond to each other, and thus the accuracy of an obtained signal is improved. It is not necessary that channels of all the transistors included in the pixels are provided in the first direction, but, as shown in FIGS. 5A to 5D, the transistors may include channels provided in the first direction and the second direction.

Although the X direction and the Y directions are perpendicular to each other in the above description, for example, an error of about ±5 degrees caused during a manufacturing process may be allowed.

In particular, for a transistor that forms a signal output path, such as an amplifier transistor and a pixel selection transistor, it is desirable that the characteristics of the transistors correspond to each other between the focus detection devices. It is desirable that at least the directions of the channels of amplifier transistors are the same between two focus detection devices that form a pair.

Second Embodiment

Another embodiment will be described. Differences from the first embodiment will be mainly described.

Figure 6:
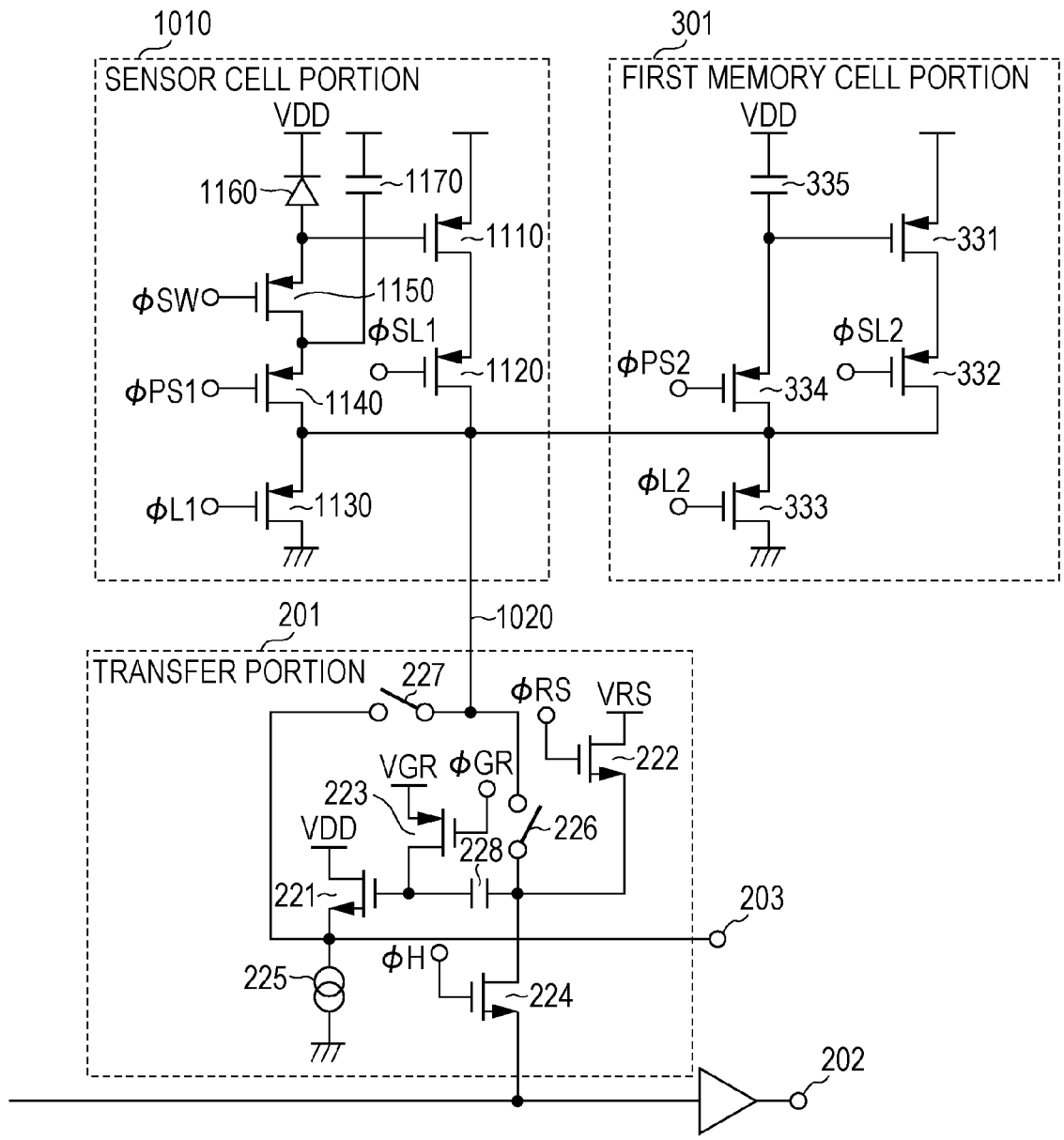
FIG. 6 is an equivalent circuit diagram of a pixel of a focus detection sensor according to a second embodiment.

FIG. 6 shows a unit pixel pix and a transfer portion connected to the unit pixel pix. The unit pixel pix corresponds to a pixel shown in the first embodiment. The unit pixel pix includes a sensor cell portion 1010 and a first memory cell portion 301. In FIG. 6, "φX" given to a control electrode of a MOS transistor and a switch indicates a signal supplied from a control unit not shown in FIG. 6.

In the unit pixel pix, the sensor cell portion 1010 includes a photodiode (PD) 1160 which is a photoelectric converter, MOS transistors 1110 to 1150, and a capacitance element (CP) 1070 which is a capacitance portion. When the MOS transistor 1120 which is a pixel select portion becomes conductive, the MOS transistor 1110 operates as a reverse amplifier whose gain is −1 along with the load MOS transistor 1130. The MOS transistor 1110 is a pixel output portion that outputs a signal based on an electric charge generated by the photoelectric converter. The control electrode of the MOS transistor 1110 functions as an input terminal of the reverse amplifier and is connected to the anode of the PD 1160 and one main electrode of the MOS transistor 1150 which is a sensitivity change switch. Thereby, the sensor cell portion 1010 may operate in a low sensitivity mode and a high sensitivity mode. Specifically, in the low sensitivity mode, the PD 1160 and the CP 1170 are electrically connected to each other, and in the high sensitivity mode, the PD 1160 and the CP 1170 are electrically insulated from each other. The other terminal of the MOS transistor 1150 is connected to one terminal of the CP 1170 and one main electrode of the MOS transistor 1140. The other main electrode of the MOS transistor 1140 is connected to one terminal of the load MOS transistor 1130 and one terminal of the MOS transistor 1120. The other main electrode of the MOS transistor 1120 is connected to one main electrode of the MOS transistor 1110. In such a configuration, when the sensor cell portion 1010 is in the high sensitive mode, the MOS transistor 1150 is in a non-conductive state and a parasitic capacitance Cpd of the PD 1160 determines the sensitivity of the sensor cell portion. On the other hand, when the sensor cell portion 1010 is in the low sensitive mode, the MOS transistor 1150 which is a switch portion becomes conductive by a signal φSW, so that the photodiode 1160 and the capacitance element 1170 are connected in parallel with respect to a path from a power supply voltage VDD to GND. Therefore, a sum of the parasitic capacitance Cpd of the PD 1160 and a capacitance value CP of the capacitance element 1170 (Cdp+CP) determines the sensitivity of the sensor cell portion.

The MOS transistors 1140 and 1150 function as a write switch for writing a pixel portion reset noise when a residual electric charge of the PD 1160 is reset by signals φPS1 and φSW.

The first memory cell portion 301 includes a memory capacitance 335 and MOS transistors 331 to 334. The first memory cell portion 301 has a configuration in which the photodiode 1160, the capacitance element 1170, and the MOS transistor 1150 of the sensor cell portion 1010 are replaced by the memory capacitance 335. Functions of the MOS transistors 331 to 334 are the same as those of the MOS transistors of the sensor cell portion 1010.

A transfer portion 201 includes MOS transistors 221 to 224, a constant current source 225, a transfer switch 226, a feedback switch 227, and a transfer capacitance 228. A signal held by each memory cell portion is outputted from the reverse amplifier thereof, and when the transfer switch 226 is conductive and the MOS transistor 224 becomes conductive by a signal φH inputted from a shift register not shown in FIG. 6, the signal outputted from the reverse amplifier is transferred to a buffer amplifier 202.

A common output line 1020 is connected to one terminal of the transfer switch 226 and one terminal of the feedback switch 227. This node N4 doubles as an input terminal and a first output terminal of the transfer portion. The other terminal of the transfer switch 226 is connected to one main electrode of the MOS transistor 222, one main electrode of the MOS transistor 224, and one terminal of the transfer capacitance 228. The other main electrode of the MOS transistor 222 is connected to a power supply voltage VRS. The other main electrode of the MOS transistor 224 is connected to the buffer amplifier 202 through a second output terminal N5 of the transfer portion. The other terminal of the transfer capacitance 228 is connected to one main electrode of the MOS transistor 223 and the control electrode of the MOS transistor 221. The other main electrode of the MOS transistor 223 is connected to a power supply voltage VGR. The power supply voltage VGR satisfies a relationship of VGR=VRS+Vth when the threshold voltage of the MOS transistor 221 is Vth. The MOS transistor 221 and the constant current source 225 forms a source follower circuit and the output of the source follower circuit is connected to the other terminal of the feedback switch 227. The output terminal of the source follower circuit is also connected to a third output terminal N6 of the transfer portion 201 and the third output terminal N6 is connected to a post-stage monitor portion.

The monitor portion monitors in real time a signal outputted from the transfer portion while automatic gain control is being performed. The monitor portion includes a variable gain amplifier, a maximum value and minimum value detector (Peak-Bottom detector; PB detector), a PK comparator, and the like.

Figure 7:
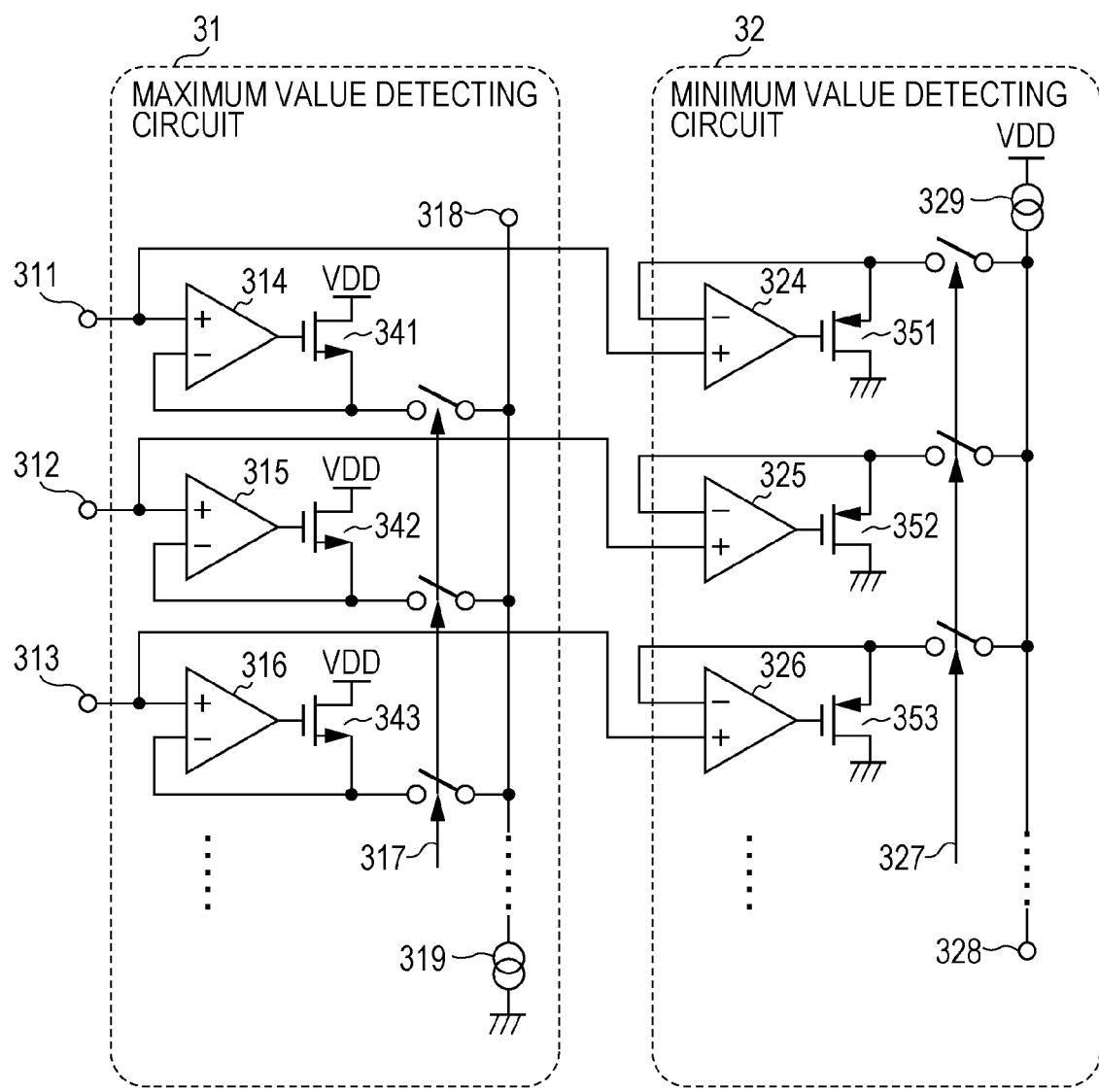
FIG. 7 is a diagram showing a configuration of a maximum value and minimum value detector of the focus detection sensor according to the second embodiment.

The PB detector shown in FIG. 7 includes a maximum value detecting circuit 31 and a minimum value detecting circuit 32 and input terminals 311, 312, and so on are connected to an output of each monitor portion. Here, regarding the maximum value detecting circuit 31 and the minimum value detecting circuit 32, a configuration for three unit pixels is extracted and shown. A signal inputted in an input terminal 311 is connected to the non-inverting input of amplifiers 314 and 324. The source electrode of an NMOS transistor 341 whose control electrode receives an output of the amplifier 314 is connected to the inverting input of the amplifier 314. In the maximum value detecting circuit 31, when a switch becomes conductive by a signal 317, a plurality of NMOS transistors 341, 342, and so on and a common constant current source load 319 form a source follower. By this configuration, a maximum value of a plurality of inputs to the maximum value detecting circuit 31 is transmitted to a maximum value and minimum value comparator (PEAK-BOTTOM comparator; PB comparator) as a PEAK output 318.

On the other hand, although the minimum value detecting circuit 32 has a similar configuration to that of the maximum value detecting circuit 31, the minimum value detecting circuit 32 is different from the maximum value detecting circuit 31 in a point that PMOS transistors 351, 352, and so on and a constant current source load 329 form a source follower. By this configuration, a minimum value of a plurality of inputs to the minimum value detecting circuit 32 is transmitted to the PB comparator as a BOTTOM output 328.

Figure 8:
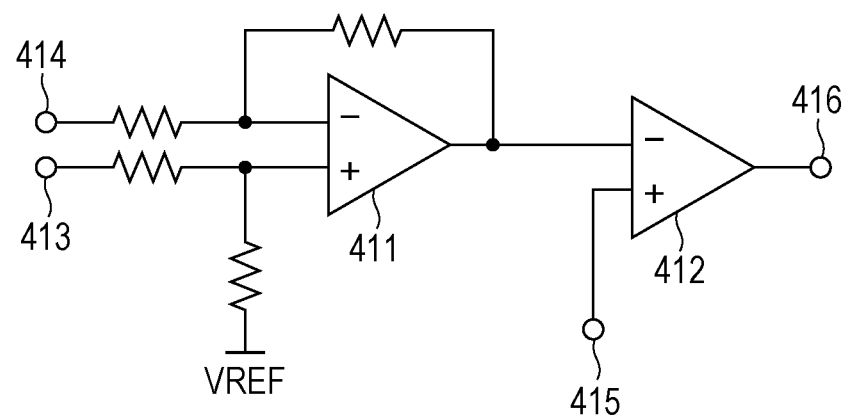
FIG. 8 is a diagram showing a configuration of a PB comparator of the focus detection sensor according to the second embodiment.

FIG. 8 is a diagram showing a configuration example of the PB comparator. The PB comparator obtains a differential signal between the PEAK output 318 and the BOTTOM output 328 of the PB detector shown in FIG. 7. In FIG. 8, an input terminal 413 is connected to the PEAK output 318 and an input terminal 414 is connected to the BOTTOM output 328. Both input signals are supplied to a differential amplifier 411 and a differential signal of the differential amplifier 411 is supplied from the output terminal of the differential amplifier 411 to the inverting input terminal of a comparator 412. A low voltage VDAC 415 set by a digital-analog (DA) converter not shown in FIG. 8 is inputted in the non-inverting input terminal of the comparator and the low voltage VDAC 415 and the differential signal are compared. A result of the comparison, that is, a contrast, is greater than or equal to a threshold value, a control unit not shown in FIG. 8 ends an accumulation operation of the sensor cell portion 1010. For example, the value of the VDAC 415 is varied such as 1.6 V, 0.8 V, 0.4 V, and 0.2 V corresponding to gain values ×5, ×10, ×20, and ×40 of the variable gain amplifier of the monitor portion.

Figure 9:
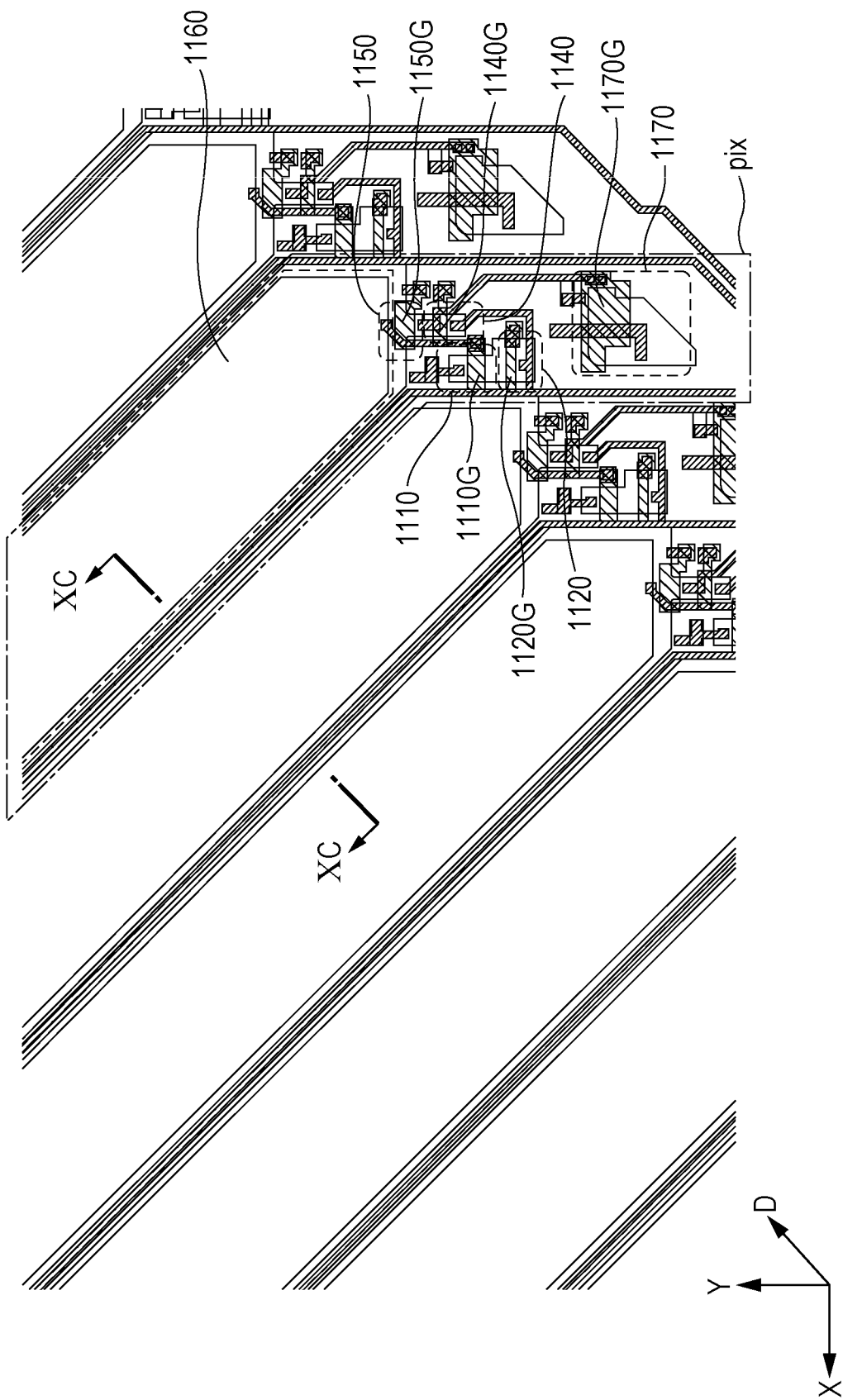
FIG. 9 is a schematic plan view showing a sensor cell portion of the focus detection sensor according to the second embodiment.

FIG. 9 shows a layout of the sensor cell portion according to the present embodiment. Here, in the same manner as the focus detection device shown in FIG. 5D, a state in which a plurality of pixels are arranged in the D direction is shown. Portions corresponding to portions shown in FIG. 6 are enclosed by a dashed line and the same reference numerals as those in FIG. 6 are given. However, the MOS transistor 1130 is not shown.

The photoelectric conversion portion 1160 extends in a direction perpendicular to the D direction and the MOS transistors forming a part of the sensor cell portion are arranged below at right of the photoelectric conversion portion 1160.

As shown in FIG. 9, the gate electrodes of the MOS transistors 1110, 1120, 1140, and 1150 extend in the X direction in FIG. 9 and the channels thereof are provided in the Y direction.

Figure 10A:
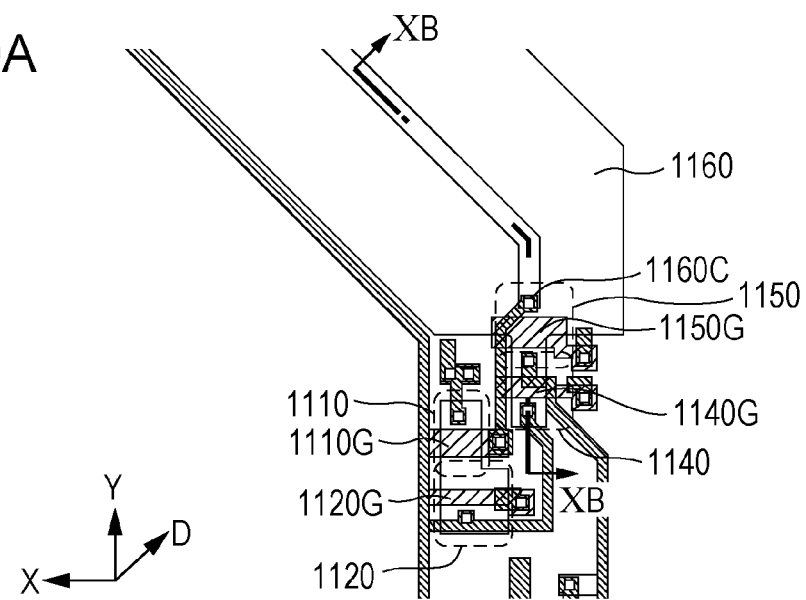
FIG. 10A is a schematic plan view showing the sensor cell portion of the focus detection sensor according to the second embodiment.

FIG. 10A is an enlarged view of transistors in one sensor cell portion of the configuration shown in FIG. 9. In FIG. 10A, the photoelectric conversion portion 1160 is connected to the gate electrode of the MOS transistor 1110 through wiring. The photoelectric conversion portion 1160 and the gate electrode 1150G form the MOS transistor 1150.

The drain terminal of the MOS transistor 1150 and the source terminal of the MOS transistor 1140 share an impurity diffusion region. The impurity diffusion region that forms the drain terminal of the MOS transistor 1140 is connected to the common output line 1020. The impurity diffusion region shared by the MOS transistors 1140 and 1150 is connected to the capacitance 1170 through wiring.

An impurity diffusion region that forms the source terminal of the MOS transistor 1110 is connected to the power supply VDD through wiring and an impurity diffusion region that forms the drain terminal of the MOS transistor 1110 is connected to the MOS transistor 1120. The drain terminal of the MOS transistor 1110 and the source terminal of the MOS transistor 1120 share an impurity diffusion region.

The impurity diffusion region that forms the source terminal of the MOS transistor 1120 is connected to the common output line 1020.

Figure 10B:
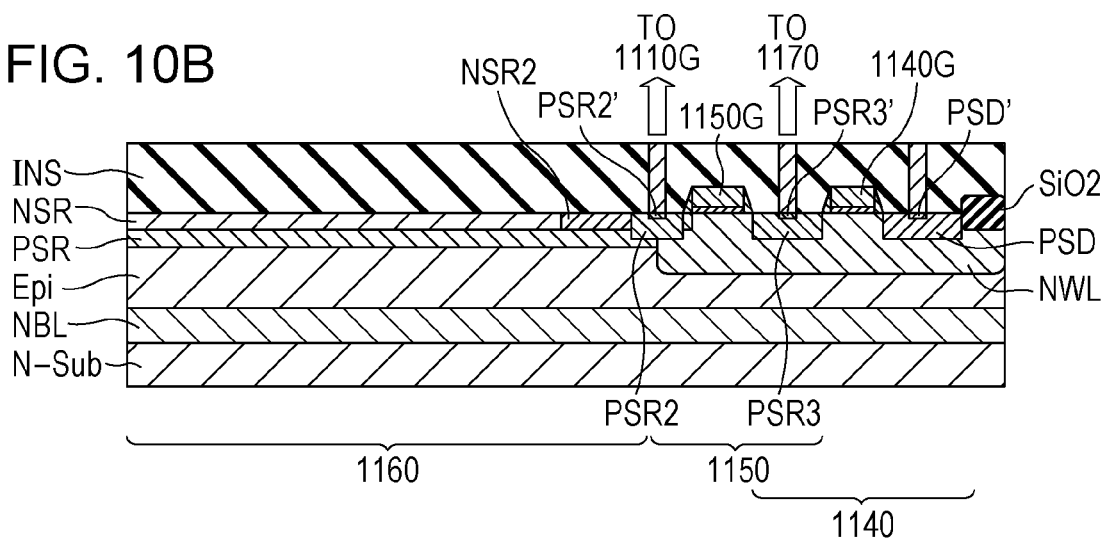
FIGS. 10B and 10C are cross-sectional views showing the sensor cell portion of the focus detection sensor according to the second embodiment.

FIG. 10B shows a cross-sectional view taken along line XB-XB in FIG. 10A.

An N-type (first conductivity type) semiconductor substrate N-Sub has an N-type region NBL on the N-type semiconductor substrate NBL and further has an epitaxially grown layer Epi on the N-type region NBL.

A P-type (second conductivity type) semiconductor region PSR is provided in the epitaxial layer Epi. The semiconductor region PSR and the epitaxial layer Epi form the photoelectric conversion portion 1160. A positive electric charge, which is generated in the photoelectric conversion portion 1160 when the photoelectric conversion portion 1160 receives light, is accumulated in the semiconductor region PSR. N-type semiconductor regions NSR1 and NSR2 and a P-type semiconductor region PSR2 are formed on the semiconductor region PSR so as to cover the semiconductor region PSR. The semiconductor regions NSR1 and NSR2 are set to a fixed potential in a normal operation. The semiconductor region PSR2 has an impurity concentration higher than that of the semiconductor region PSR and includes a P-type semiconductor region PSR2' having an impurity concentration higher than that of the semiconductor region PSR2. The semiconductor region PSR2' is connected to the gate electrode of the transistor 111 through wiring including a plug P1.

Further, an N-type well region NWL is formed in the epitaxial layer Epi. The transistors 115 and 114 are formed on the N-type well region NWL. A P-type semiconductor region PSR3 and a P-type semiconductor region PSD are formed in the well region NWL. SiO2 is a silicon oxide film for separating elements from each other.

The gate electrode 1150G is provided near the semiconductor regions PSR2 and PSR3 and over the well region NWL with an insulting film in between.

The semiconductor region PSR3 is connected to the capacitance element 1170 through a semiconductor region PSR3' having an impurity concentration higher than that of the semiconductor region PSR3 and wiring.

The gate electrode 1140G is provided near the semiconductor regions PSR3 and PSD and over the well region NWL with an insulting film in between.

The semiconductor region PSD is connected to the common output line 1020 through a semiconductor region PSD' having an impurity concentration higher than that of the semiconductor region PSD and wiring.

Although FIG. 10 shows an example in which the photoelectric conversion portion 1160 and the MOS transistor 1150 are formed in the same active region, the photoelectric conversion portion 1160 and the MOS transistor 1150 may be formed in active regions different from each other.

Figure 10C:
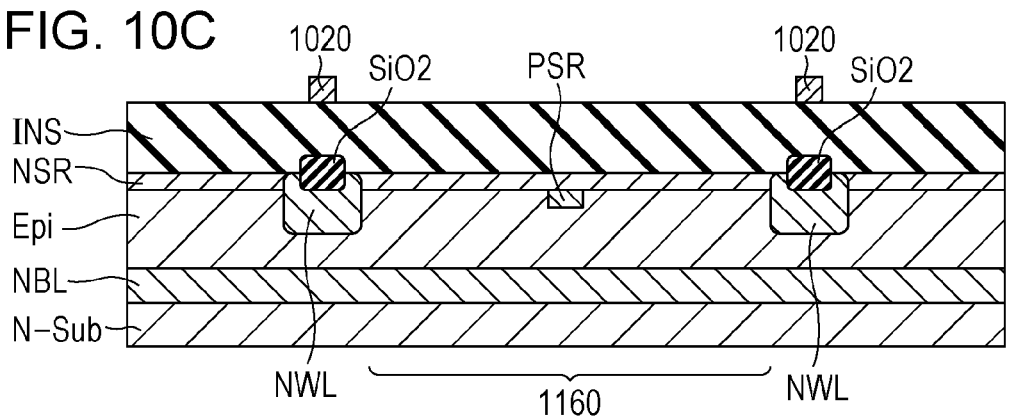

FIG. 10C shows a cross-sectional view taken along line XC-XC in FIG. 9. FIG. 10C shows the photoelectric conversion portion 1160 related to three sensor cells adjacent to each other. As understood from FIG. 10C, the semiconductor region PSR formed in the epitaxial layer Epi is located in only a part of the cross section taken along line XC-XC and surrounded by the epitaxial layer Epi. The photoelectric conversion portions 1160 of adjacent pixels are separated by the well region NWL and the silicon oxide film SiO2.

A metal wire layer that forms the common output line 1020 is provided above the silicon oxide film SiO2 with an insulating layer INS in between.

Figure 11:
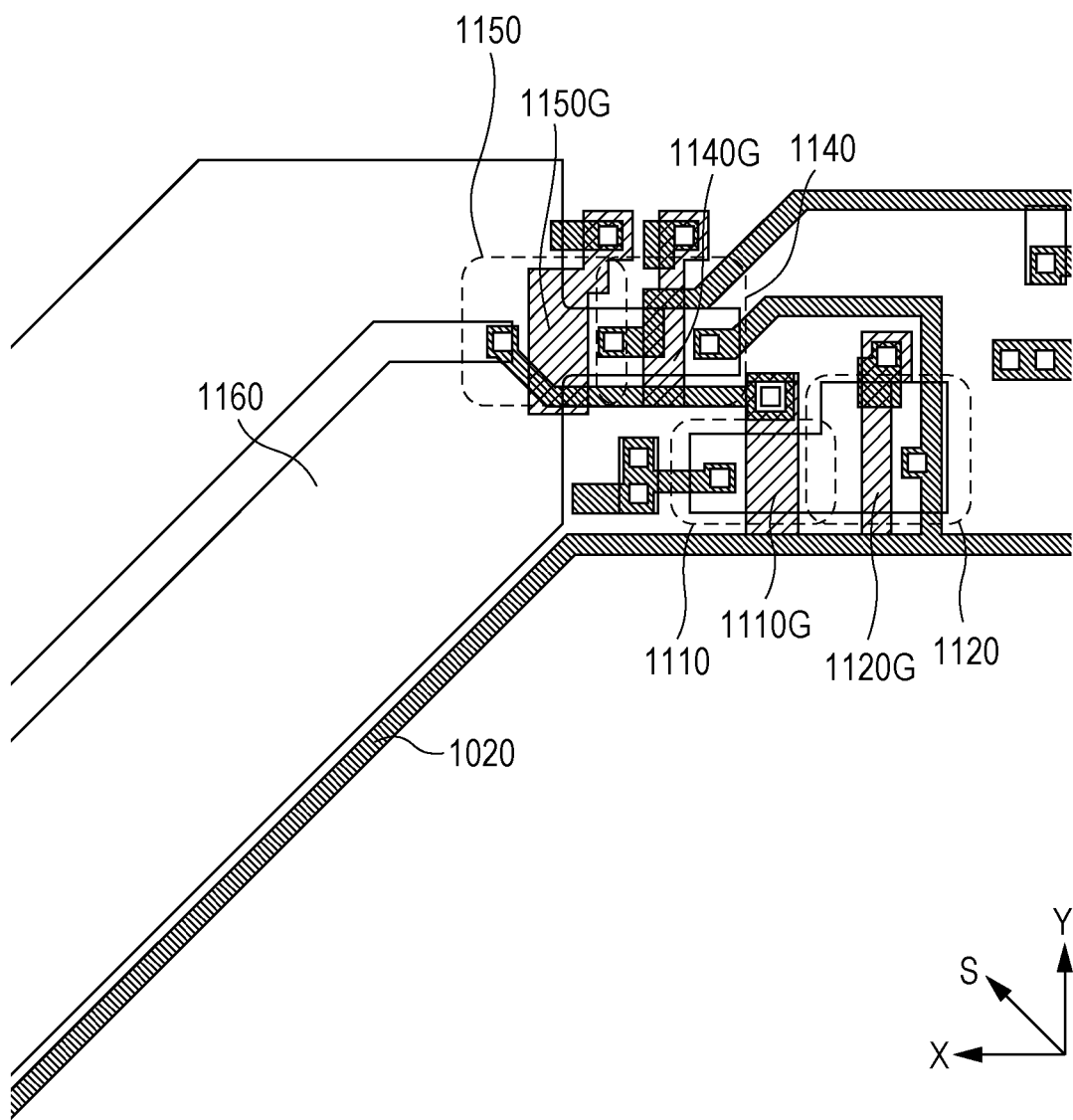
FIG. 11 is a schematic plan view showing the sensor cell portion of the focus detection sensor according to the second embodiment.

Next, in the same manner as the focus detection device shown in FIG. 5C, a layout of the sensor cell portion in which a plurality of pixels are arranged in the S direction will be described. FIG. 11 is a plan view showing a part of one sensor cell portion.

In the same manner as in the plan view of FIG. 10A, portions corresponding to portions shown in FIG. 6 are enclosed by a dashed line and the same reference numerals as those in FIG. 6 are given.

A configuration shown in FIG. 11 is obtained by rotating the configuration shown in FIG. 10A in a counterclockwise direction by 90 degrees. In other words, while a plurality of sensor cell portions are arranged in the S direction (third direction) in FIG. 10A, a plurality of sensor cell portions are arranged in the D direction (fourth direction) in FIG. 11. Also, while the direction of the channels of the transistors 1110, 1120, 1140, and 1150 is the Y direction (first direction) in FIG. 10A, the direction of the channels of the transistors 1110, 1120, 1140, and 1150 is the X direction (second direction) in FIG. 11.

Although not shown in the drawings, the focus detection devices shown in FIGS. 5A and 5B have a configuration similar to that shown in FIGS. 11 and 10A. Specifically, in the focus detection device shown in FIG. 5A, the photoelectric conversion portion including the epitaxial layer Epi and the P-type semiconductor region PSR of the configuration shown in FIG. 11 extends in the X direction instead of the D direction. Also, in the focus detection device shown in FIG. 5B, the photoelectric conversion portion including the epitaxial layer Epi and the P-type semiconductor region PSR of the configuration shown in FIG. 10A extends in the Y direction instead of the S direction.

As described above, in the photoelectric conversion apparatus including a plurality of pixels arranged in the first direction, a plurality of pixels arranged in the second direction, and a plurality of pixels arranged in the third direction, the second direction is perpendicular to the first direction and the third direction is not perpendicular to the first direction and the second direction. The channels of the transistors included in the plurality of pixels arranged in the first direction, the plurality of pixels arranged in the second direction, and the plurality of pixels arranged in the third direction are provided in the first or the second direction. By this configuration, it is possible to cause the characteristics of the transistors to correspond to each other, so that the accuracy of the obtained signal is improved. It is not necessary that channels of all the transistors included in the pixels are provided in the first direction, but, as shown in FIGS. 5A to 5D, the transistors may include channels provided in the first direction and the second direction.

In particular, for a transistor that forms a signal output path, such as an amplifier transistor and a pixel selection transistor, it is desirable that the characteristics of the transistors correspond to each other between the focus detection devices. It is desirable that at least the directions of the channels of amplifier transistors are the same between two focus detection devices that form a pair.

The embodiments described above are only exemplifications for describing the disclosure. The configurations of the embodiments may be changed and one embodiment may be combined with another embodiment without departing from the scope of the present invention.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-043963 filed Feb. 29, 2012, which is hereby incorporated by reference herein in its entirety.

What is claimed is:

1. A photoelectric conversion apparatus comprising:
   a first line sensor unit in which a plurality of pixels are arranged in a first direction;
   a second line sensor unit in which a plurality of pixels are arranged in a second direction; and
   a third line sensor unit in which a plurality of pixels are arranged in a third direction,
   wherein each of the pixels includes a photoelectric conversion portion and a first transistor having a first channel in a first channel direction,
   the second direction is perpendicular to the first direction, and the third direction is a direction different from the first and the second directions, and
   the first channel direction is in the first direction or the second direction regardless of whether the pixels are in the first, second, or third direction.

2. The photoelectric conversion apparatus according to claim 1, wherein the third direction makes an angle of 45 degrees with the first direction.

3. The photoelectric conversion apparatus according to claim 1, wherein
   the pixel includes a pixel output portion that outputs a signal based on an electric charge generated in the photoelectric conversion portion and a pixel selection portion for selecting the pixel, and
   the transistor is at least one of the pixel output portion and the pixel selection portion.

4. The photoelectric conversion apparatus according to claim 1, wherein
   the pixel includes a capacitance portion and a switch portion that connects the photoelectric conversion portion and the capacitance portion.

5. The photoelectric conversion apparatus according to claim 1, further comprising:
   a fourth line sensor unit in which a plurality of pixels are arranged in the first direction and which is provided away from the first line sensor unit in the first direction;
   a fifth line sensor unit in which a plurality of pixels are arranged in the second direction and which is provided away from the second line sensor unit in the second direction; and
   a sixth line sensor unit in which a plurality of pixels are arranged in the third direction and which is provided away from the third line sensor unit in the third direction.

6. The photoelectric conversion apparatus according to claim 1, further comprising:
   a seventh line sensor unit in which a plurality of pixels are arranged in a fourth direction; and
   an eighth line sensor unit in which a plurality of pixels are arranged in the fourth direction and which is provided away from the seventh line sensor unit in the fourth direction,
   wherein the fourth direction is a direction different from the first to the third directions.

7. The photoelectric conversion apparatus according to claim 1, wherein
   each of the pixels further includes a second transistor having a second channel in a second channel direction,
   the first channel direction is in the first direction,
   and the second channel direction is in the second direction, regardless of whether the pixels are in the first, second, or third direction.

8. The photoelectric conversion apparatus according to claim 4, wherein
   the switch portion includes the transistor.

9. The photoelectric conversion apparatus according to claim 6, wherein
   the fourth direction is perpendicular to the third direction.

10. A focus detection apparatus comprising:
    the photoelectric conversion apparatus according claim 6,
    wherein the first and the fourth line sensor units form a pair,
    the second and the fifth line sensor units form a pair,
    the third and the sixth line sensor units form a pair,
    the seventh and the eighth line sensor units form a pair, and
    a focal point is detected by using at least one of the pairs.

11. An image pickup system comprising:
    the focus detection apparatus according claim 10;
    an image pickup device including a plurality of pixels arranged in a matrix pattern; and
    an optical system which guides light from an object to the image pickup device and which divides the light guided to the image pickup device and guides the divided light to the focus detection apparatus,
    wherein rows of the pixels of the image pickup device are arranged in the first direction, and
    columns of the pixels of the image pickup device are arranged in the second direction.

12. A focus detection apparatus comprising:
    the photoelectric conversion apparatus according claim 9,
    wherein the first and the fourth line sensor units form a pair, the second and the fifth line sensor units form a pair,
the third and the sixth line sensor units form a pair,
the seventh and the eighth line sensor units form a pair, and
a focal point is detected by using at least one of the pairs.

13. An image pickup system comprising:
the focus detection apparatus according claim 12;
an image pickup device including a plurality of pixels arranged in a matrix pattern; and
an optical system which guides light from an object to the image pickup device and which divides the light guided to the image pickup device and guides the divided light to the focus detection apparatus,
wherein rows of the pixels of the image pickup device are arranged in the first direction, and
columns of the pixels of the image pickup device are arranged in the second direction.

* * * * *